US010063864B2

(12) United States Patent
Kulkarni et al.

(10) Patent No.: US 10,063,864 B2
(45) Date of Patent: Aug. 28, 2018

(54) SYSTEM AND METHOD FOR COMPRESSION AND DECOMPRESSION OF TEXT DATA

(71) Applicant: Centre for Development of Advanced Computing (C-DAC), Pune, Maharashtra (IN)

(72) Inventors: Mahesh Dattatray Kulkarni, Pune (IN); Ajay Sharadchandra Lohokare, Pune (IN); Umesh Hareshwar Vithalkar, Pune (IN); Swapnil Dnyaneshwar Belhe, Pune (IN); Vinodkumar Tejlal Pache, Pune (IN)

(73) Assignee: Centre for Development of Advanced Computing (C-DAC), Pune, Maharashtra ( * ) Notice: Subject to any disclaimer, the term of this patent is extended or adjusted under 35 U.S.C. 154(b) by 0 days.

(21) Appl. No.: 15/438,745

(22) Filed: Feb. 21, 2017

(65) Prior Publication Data

US 2017/0257634 A1 Sep. 7, 2017

(30) Foreign Application Priority Data

Mar. 2, 2016 (IN) .............................. 201621007382

(51) Int. Cl.
*G06K 9/46* (2006.01)
*H04N 19/184* (2014.01)
(Continued)

(52) U.S. Cl.
CPC ......... *H04N 19/184* (2014.11); *G06K 9/6218* (2013.01); *H04N 19/44* (2014.11)

(58) Field of Classification Search
CPC .... G04N 19/184; G04N 19/44; G06K 9/6218; G06F 17/2223; G06F 17/30905
See application file for complete search history.

(56) References Cited

U.S. PATENT DOCUMENTS 8,497,788 B1 7/2013 Miller et al.
8,872,679 B1 10/2014 Roberts et al.
(Continued)

OTHER PUBLICATIONS

Abdullah A. Abdullah, "Enhancing Cost and Security of Arabic SMS Messages over mobile phone network", Nov. 23, 2008, p. 111-127.

*Primary Examiner* — Ali Bayat
(74) *Attorney, Agent, or Firm* — HM Law Group LLP; Vani Moodley, Esq.

(57) ABSTRACT

The present disclosure relates to system(s) and method(s) for compression and decompression of Unicode characters. The system is configured to maintain a set of character tables and a cluster table in a memory. Each character table is configured to store a set of Unicode characters corresponding to a character class of a set of characters classes, wherein each Unicode character from the character table is assigned with a shortened bit representation. Furthermore, the cluster table may be configured to maintain a set of cluster types and a cluster identifier corresponding to each of the cluster type. The system is configured to compress text data in Unicode format using the set of character tables and the cluster table by identifying the different clusters in each word and replacing the clusters with cluster identifier followed by the shorten bit representation of characters in each cluster.

14 Claims, 12 Drawing Sheets

(51) Int. Cl.
*H04N 19/44* (2014.01)
*G06K 9/62* (2006.01)

(56) References Cited

U.S. PATENT DOCUMENTS

| | | | |
|---|---|---|---|
| 9,658,988 B2* | 5/2017 | Albright | G06F 17/211 |
| 2012/0109634 A1* | 5/2012 | Lanin | G06F 17/2223 |
| | | | 704/8 |
| 2012/0253814 A1* | 10/2012 | Wang | G06F 17/30905 |
| | | | 704/260 |
| 2013/0173564 A1 | 7/2013 | Roberts et al. | |
| 2014/0363074 A1* | 12/2014 | Dolfing | G06K 9/00979 |
| | | | 382/156 |

* cited by examiner

| Sample Text: गुरुत्वाकर्षण तरंगें रोशनी की रफ़्तार सन्मात्रा करती हैं. |||||||||
|---|---|---|---|---|---|---|---|---|
| Clustering : गु रु त्वा क र्ष ण 'Sp' त रं गें 'Sp' रो श नी 'Sp' की 'Sp' र फ़्ता र 'Sp' स☐Sp' या त्रा 'Sp' क र ती 'Sp' हैं. |||||||||
| Cluster | Char Combination | Cluster Identifier | H1 | H2 | H3 | Char code from Character Table || | Bit Stream |
| गु | ग + ु | H13 | 10 | -- | -- | 00010 | 0011 | | 10000100011 |
| रु | र + ु | H13 | 10 | -- | -- | 11000 | 0011 | | 10110000011 |
| त्वा | त + ् + □ + ा | H23 | 11 | 010 | -- | 01101 | 1100 | 11011 0000 | 11010011011100110110000 |
| क | क | H12 | 01 | -- | -- | 00000 | | | 0100000 |
| र्ष | र + ् + ष | H22 | 11 | 001 | -- | 11000 | 1100 | 11101 | 1100111000110011101 |
| ण | ण | H12 | 01 | -- | -- | 01100 | | | 0101100 |
| 'Sp' | Space | H11 | 00 | -- | -- | 1111 | | | 001111 |
| त | त | H12 | 01 | -- | -- | 01101 | | | 0101101 |
| रं | र + ं | H13 | 10 | -- | -- | 11000 | 1110 | | 10110001110 |
| गें | ग + □+ ं | H21 | 11 | 000 | -- | 00010 | 0111 | 1110 | 110000001001111110 |
| 'Sp' | Space | H11 | 00 | -- | -- | 1111 | | | 001111 |
| रो | र + ो | H13 | 10 | -- | -- | 11000 | 1010 | | 10110001010 |
| श | श | H12 | 01 | -- | -- | 11100 | | | 0111100 |
| नी | न + ी | H13 | 10 | -- | -- | 10001 | 0010 | | 10100010010 |
| 'Sp' | Space | H11 | 00 | -- | -- | 1111 | | | 001111 |
| की | क + ी | H13 | 10 | -- | -- | 0000 | 0010 | | 1000000010 |
| 'Sp' | Space | H11 | 00 | -- | -- | 1111 | | | 001111 |
| र | र | H12 | 01 | -- | -- | 11000 | | | 0111000 |
| फ़्ता | फ़ + ् + त + ा | H39 | 11 | 111 | 1000 | 010010 | 1100 | 01101 0000 | 1111110000100101100011010000 |
| र | र | H12 | 01 | -- | -- | 11000 | | | 0111000 |
| 'Sp' | Space | H11 | 00 | -- | -- | 1111 | | | 001111 |
| स☐ | स + ☐ | H13 | 10 | -- | -- | 11110 | 0111 | | 10111100111 |
| 'Sp' | Space | H11 | 00 | -- | -- | 1111 | | | 001111 |
| या | य + ा | H13 | 10 | -- | -- | 10111 | 0000 | | 10101110000 |
| त्रा | त + ् + र + ा | H23 | 11 | 010 | -- | 01101 | 1100 | 11000 0000 | 11010011011100110000000 |
| 'Sp' | Space | H11 | 00 | -- | -- | 1111 | | | 001111 |
| क | क | H12 | 01 | -- | -- | 00000 | | | 0100000 |

FIGURE 8

| र | र | H12 | 01 | -- | -- | 11000 | | | 0111000 |
|---|---|---|---|---|---|---|---|---|---|
| ती | त + ी | H13 | 10 | -- | -- | 01101 | 0010 | | 10011010010 |
| 'Sp' | Space | H11 | 00 | -- | -- | 1111 | | | 001111 |
| हैं | ह + ै + ं | H21 | 11 | 000 | -- | 11111 | 1000 | 1110 | 110001111110001110 |
| . | Dot | H11 | 00 | -- | -- | 1110 | | | 001110 |
| Uncompressed Bits | 56 Unicode Char x 16 = 896 | | | | | | | | |
| Bit Stream | 1000010001110110000011110100110111001101100000100000110011100 0110011101010110000111101011011011000111011000000100111111000 1111101100010100111100101000100100011111000000001000111101110 0011111100001010111000110100000011100000111110111100111001111 0101110000110100110111001100000000011110100000011100010011010 0100011111100011111110001110001110 (Total 338 Bits) |
| Number of Bytes (First 2 Bytes) | 338/8=42 ==> 002A Hex |
| Number of Bits (Third Byte) | 338 MOD 8 = 02 ==> 02 Hex |
| Compressed Line (Hex) | 00 2A 02 84 76 0F 4D CD 82 0C E3 3A B0 F5 B6 3B 02 7E 3E C5 3C A2 47 C0 23 DC 7E 15 C6 83 83 EF 39 F5 C3 4D CC 01 E8 1C 4D 23 F1 F8 E3 80 |
| Over All Compression | 100 - [((338+24)x100)/896] = 59.6% |

FIGURE 8 (continued)

| Compressed Line (Hex): :002A0284760F4DCD820CE33AB0F5B63B027E3EC53CA247C023DC7E15C6838 3EF39F5C34DCC01E81C4D23F1F8E380 | | | | | | | | | | | | |
|---|---|---|---|---|---|---|---|---|---|---|---|---|
| Number of bytes in bit stream | First 2 bytes | | 002A | | Total 42 (Decimal) bytes are there in bit stream | | | | | | | |
| Number of bits in last byte | Third byte | | 02 | | Only 2 bit is relevant from last byte | | | | | | | |
| Bit Stream | Binary representation of compressed line from third byte | | | | | | | | | | | |
| 10000100011101100000111101001101110011011000001000001100111000110011101010110000111101011011010 0011101100000100111111000111110110001010011110010100010010001111100000000100011110111000111111 00001010111000110100000111000001111101111001100111110101110000110100110111001100000000011110100 0 00011100010011010010001111110001111110001110001110 | | | | | | | | | | | | |
| (Total 338 Bits) | | | | | | | | | | | | |
| Check first 2 bits of bit stream | | | | | | | | | | | | |
| Compressed string | 10 | 00010 | 0011 | 10 | 11000 | 0011 | 11 | 010 | 01101 | 1100 | 11011 | 0000 | |
| Cluster Classification | H13 | | | H13 | | | ** | H23 | | | | | |
| Cluster Identification | 5+4 | Cons | Matra | 5+4 | Cons | Matra | | 5+4+5+4 | Cons | Halant | Cons | Matra | |
| Unicode Character | | ग | ि | | र | ि | | | त | ् | □ | ो | |
| Cluster Generation | गु | | | रु | | | | त्वा | | | | | |
| Compressed string | 01 | 00000 | 11 | 001 | 11000 | 1100 | 11101 | 01 | 01100 | 00 | 1111 | 01 | 01101 |
| Cluster Classification | H12 | | ** | H22 | | | | H12 | | H11 | | H12 | |
| Cluster Identification | 5 | Cons | | 5+4+5 | Cons | Halant | Cons | 5 | Cons | 4 | Vow | 5 | Cons |
| Unicode Character | | क | | | र | ् | ष | | ण | | Space | | त |
| Cluster Generation | क | | ष् | | | | ण | | Sp | | त | | |
| Compressed string | 10 | 11000 | 1110 | 11 | 000 | 00010 | 0111 | 1110 | 00 | 1111 | 10 | 11000 | 1010 |
| Cluster Classification | H13 | | | ** | H21 | | | | H11 | | H13 | | |
| Cluster Identification | 5+4 | Cons | Matra | | 5+4+4 | Cons | Matra | Matra | 4 | Vow | 5+4 | Cons | Matra |
| Unicode Character | | र | ं | | | ग | □ | ं | | Space | | र | ो |
| Cluster Generation | रं | | | | गें | | | | Sp | | रो | | |

FIGURE 9

| Compressed string | 01 | 11100 | 10 | 10001 | 0010 | 00 | 1111 | 10 | 0000 | 0010 | 00 | 1111 | |
|---|---|---|---|---|---|---|---|---|---|---|---|---|---|
| Cluster Classification | H12 | | H13 | | | H11 | | H13 | | | H11 | | |
| Cluster Identification | 5 | Cons | 5+4 | Cons | Matra | 4 | Vow | 5+4 | Cons | Matra | 4 | Vow | |
| Unicode Character | | श | | न | ी | | Space | | क | ी | | Space | |
| Cluster Generation | | श | | नी | | | Sp | | की | | | Sp | |
| Compressed string | 01 | 11000 | 11 | 111 | 1000 | 010010 | 1100 | 01101 | 0000 | 01 | 11000 | 00 | 1111 |
| Cluster Classification | H12 | | ** | *** | H39 | | | | | H12 | | H11 | |
| Cluster Identification | 5 | Cons | | | 5+4+5+4 | NuktaCh | Halant | Cons | Matra | 5 | Cons | 4 | Vow |
| Unicode Character | | र | | | | फ़ | ्  | त | ो | | र | | Space |
| Cluster Generation | र | | | फ़्ता | | | | | | र | | Sp | |
| Compressed string | 10 | 11110 | 0111 | 00 | 1111 | 10 | 10111 | 0000 | 11 | 010 | 01101 | 1100 | 11000 |
| Cluster Classification | H13 | | | H11 | | H13 | | | ** | H23 | | | |
| Cluster Identification | 5+4 | Cons | Matra | 4 | Vow | 5+4 | Cons | Matra | | 5+4+5+4 | Cons | Halant | Cons |
| Unicode Character | | स | ा | | Space | | य | ो | | | त | ्  | र |
| Cluster Generation | सा | | | Sp | | या | | | | त्र | | | |
| Compressed string | 0000 | 00 | 1111 | 01 | 00000 | 01 | 11000 | 10 | 01101 | 0010 | 00 | 1111 | |
| Cluster Classification | | H11 | | H12 | | H12 | | H13 | | | H11 | | |
| Cluster Identification | Matra | 4 | Vow | 5 | Cons | 5 | Cons | 5+4 | Cons | Matra | 4 | Vow | |
| Unicode Character | ा | | Space | | क | | र | | त | ी | | Space | |
| Cluster Generation | | Sp | | क | | र | | | ती | | | Sp | |
| Compressed string | 11 | 000 | 11111 | 1000 | 1110 | 00 | 1110 | | | | | | |
| Cluster Classification | ** | H21 | | | H11 | | | | | | | | |
| Cluster Identification | | 5+4+4 | Cons | Matra | Matra | 4 | Vow | | | | | | |
| Unicode Character | | | ह | ै | ं | | Dot | ** '11' indicates Another 3 bit Header | | | | | |
| Cluster Generation | | हैं | | | | . | | *** '111' indicates Another 4 bit Header | | | | | |
| Decompressed Text : गुरुत्वाकर्षण तरंगें रोशनी की रफ़्तार सामात्रा करती हैं. | | | | | | | | | | | | | |

FIGURE 9 (Continued)

| Sr. No. | Clusters | Examples |
|---|---|---|
| 1 | Vowel Only | आई |
| 2 | Consonant Only | कमल |
| 3 | Consonant + Matra | किताब☐ |
| 4 | Consonant + Matra + Matra | मुंबई, साँप, प्रतिबिंब |
| 5 | Consonant + Halant + Consonant | राज्य, साहीत्य, ☐िश्वकोश |
| 6 | Consonant + Halant + Consonant + Matra | प्र☐, संस्कृती, उत्कृष्ट |
| 7 | Consonant + Halant + Consonant + Matra + Matra | लज्जां, उच्छृंखल, मण्यांचा, शिल्पांनी |
| 8 | Numbers/NuktaChar/Symbol/Punctuation | ऋणी, ", ?, #, @ |
| 9 | EnglishChar | English, Pune, INDIA |
| 10 | UnicodeAs_It_Is | ", –, © |
| 11 | Lang_7Bit | आर्नोल्ड्न☐हॅण्डीकॅफड्, एन्र्ट, धाष्ट्र्य्, धर्मशास्त्र्यांचा☐☐ तर्शान |
| 12 | Vowel + Matra | ऊँ☐, आः, आंध्राचा |
| 13 | Consonant + Sp. Matra | बाढ़, ज़रिए, नज़र, ☐ग्लैंड़ |
| 14 | NuktaChar + Matra | दुसरा |
| 15 | Consonant + Halant + NuktaChar | शास्त्रज्ञ |
| 16 | NuktaChar + Halant + Consonant | ☐ाञ्छति, ☐ाङ्मय |
| 17 | Consonant + Sp. Matra + Matra | पीड़ित, मृत्यु, हज़ारों, भड़ौच |
| 18 | ] Consonant + Halant + NuktaChar + Matra | ☐िज्ञान, आज्ञा |
| 19 | NuktaChar + Halant + Consonant + Matra | ☐न्हाड, संसारपराङ्मुख |
| 20 | Consonant + Halant + Consonant + Sp. Matra | दाश्त, पोस्त |
| 21 | Consonant + Halant + NuktaChar + Matra + Matra | शास्त्राज्ञांना |
| 22 | NuktaChar + Halant + Consonant + Matra + Matra | ☐धिकाऱ्यांनी, साऱ्यांना |
| 23 | Consonant + Halant + Consonant + Halant + Consonant | राष्ट्र, पार्श्वभूमी |
| 24 | Consonant + Halant + Consonant + Sp. Matra + Matra | उल्फ़ा, ☐ ल्फ़ाज़ |
| 25 | Consonant + Halant + Consonant + Halant + Consonant + Matra | राष्ट्रिय, मूर्च्छा, जिल्ह्यात, स्ट्र☐न्स्की, शास्त्रोक्त |
| 26 | Consonant + Halant + Consonant + Halant + Consonant + Matra + Matra | पश्यन्त्याः |

FIGURE 10

SYSTEM AND METHOD FOR COMPRESSION AND DECOMPRESSION OF TEXT DATA

CROSS-REFERENCE TO RELATED APPLICATIONS AND PRIORITY

The present application claims priority from Indian Patent Application No. 201621007382, filed on Mar. 2, 2016, the entirety of which is hereby incorporated by reference.

TECHNICAL FIELD

The present disclosure in general relates to the field of data compression. More particularly, the present invention relates to a system and method for text data compression and decompression.

BACKGROUND

Nowadays Unicode representation is widely adopted in the field of information technology for representing characters of different languages. In the Unicode representation of UTF-16 or UCS2, 16 bits are used for representing each character. The first 8 bits (MSB) of the 16 bit Unicode are used to represent the language/category, whereas the next 8 bits (LSB) are used for representing the character in the language/category. For example the character 'A' is represented in Unicode format as $0041_{hex}$, wherein the byte $00_{hex}$ represents that the character is Basic Latin Script character and the byte $41_{hex}$ represents the character 'A' in Basic Latin Script (also called ASCII). Hence, the number of bits required for representation of each character using Unicode standard UTF16 or UCS2 is 16 bits.

By making use of Unicode standards, a number of different languages can be represented digitally. However, considering Indian languages which are mostly based on Brahmi script, they do not have more than 128 widely used characters, allocating 16 bits for each character leads to unnecessary increase in the size of text data.

The existing compression techniques used in order to reduce the size of text data are based on Huffman compression. Huffman compression technique is used for reducing the size of text file by making use of symbol table. However, by making use of Huffman compression, each time a new symbol table needs to be generated. Moreover, the level of compression achieved using Huffman compression technique is not uniform and largely depends on the size of the text file being compressed.

SUMMARY

This summary is provided to introduce aspects related to systems and methods for compression and decompression of text data and the aspects are further described below in the detailed description. This summary is not intended to identify essential features of the claimed subject matter nor is it intended for use in determining or limiting the scope of the claimed subject matter.

In one embodiment, a compression system for compression of text data is illustrated. The compression system comprises a memory and a processor coupled to the memory. The processor may be configured to execute programmed instructions stored in the memory. The processor may execute a programmed instruction stored in the memory to maintain a set of character tables and a cluster table in the memory. Each character table may be configured to store a set of Unicode characters corresponding to a character class of a set of characters classes. Further, each Unicode character from the character table is assigned with a shortened bit representation. Furthermore, the cluster table may be configured to maintain a set of cluster types and a cluster identifier corresponding to each of the cluster type, wherein each cluster type corresponds to a character class or a valid combination of two or more character classes represented by the set of character tables. In one embodiment, the processor may execute a programmed instruction stored in the memory to accept an input text string comprising a combination of Unicode characters and classify the input text string into a set of clusters based on the set of cluster types in the cluster table, wherein each cluster may correspond to an Unicode character or a valid combination of two or more Unicode characters in the input text string. Further, the processor may execute a programmed instruction stored in the memory to identify a cluster identifier, from the cluster table, corresponding to each cluster from the set of clusters. Further, the processor may execute a programmed instruction stored in the memory to identify a shortened bit representation corresponding to each character, in each cluster, from the set of character tables and generate a compressed text string, corresponding to the input text string. In one embodiment the compressed text string may be generated by representing each cluster with a corresponding cluster identifier followed by the shortened bit representation corresponding to each character in the cluster.

In one embodiment, a decompression system for decompression of a compressed text data is illustrated. The decompression system comprises a memory and a processor coupled to the memory. The processor may be configured to execute programmed instructions stored in the memory. The processor may execute a programmed instruction stored in the memory to maintain a set of character tables and a cluster table in the memory. In one embodiment, each character table may be configured to store a set of Unicode characters corresponding to a character class of a set of characters classes, wherein each Unicode character from the character table is assigned with a shortened bit representation. Further, the cluster table may be configured to maintain a set of cluster types and a cluster identifier corresponding to each of the cluster type, wherein each cluster type corresponds to a character class or a valid combination of two or more character classes represented by the set of character tables. In one embodiment, the processor may execute a programmed instruction stored in the memory to accept a compressed text string, wherein the compressed text string is a set of clusters, wherein each cluster is represented with a cluster identifier followed by shortened bit representation corresponding to each Unicode character in each cluster. Further, the processor may execute a programmed instruction stored in the memory to classify the compressed text string into a set of clusters, wherein each cluster is identified based on a corresponding cluster identifier and the set of cluster types in the cluster table. Further, the processor may execute a programmed instruction stored in the memory to identify a shortened bit representation and corresponding character table for each character in the cluster based on the cluster type applicable to the cluster. Further, the processor may execute a programmed instruction stored in the memory to generate a Unicode text string by representing each shortened bit representation in the cluster with a corresponding Unicode character, wherein the Unicode character is identified from the corresponding character table.

In one embodiment, a method for compression of text data is illustrated. The method may comprise maintaining a set of character tables and a cluster table in a memory. In one embodiment, each character table may be configured to store a set of Unicode characters corresponding to a character class of a set of characters classes, wherein each Unicode character from the character table is assigned with a shortened bit representation. Further, the cluster table may be configured to maintain a set of cluster types and a cluster identifier corresponding to each of the cluster type, wherein each cluster type corresponds to a character class or a valid combination of two or more character classes represented by the set of character tables. The method may further comprise accepting an input text string comprising a combination of Unicode characters and classifying the input text string into a set of clusters based on the set of cluster types in the cluster table. In one embodiment, each cluster from the set of clusters may correspond to a Unicode character or a valid combination of two or more Unicode characters in the input text string. The method may further comprise identifying a cluster identifier, from the cluster table, corresponding to each cluster from the set of clusters. The method may further comprise identifying a shortened bit representation corresponding to each character, in each cluster, from the set of character tables. The method may further comprise generating a compressed text string, corresponding to the input text string, by representing each cluster with a corresponding cluster identifier followed by the shortened bit representation corresponding to each character in the cluster.

In one embodiment, a method for decompression of compressed text data is illustrated. The method may comprise maintaining a set of character tables and a cluster table in a memory. In one embodiment, each character table may be configured to store a set of Unicode characters corresponding to a character class of a set of characters classes, wherein each Unicode character from the character table is assigned with a shortened bit representation. Further, the cluster table may be configured to maintain a set of cluster types and a cluster identifier corresponding to each of the cluster type, wherein each cluster type corresponds to a character class or a valid combination of two or more character classes represented by the set of character tables. The method may further comprise accepting a compressed text string, wherein the compressed text string is a set of clusters, wherein each cluster is represented with a cluster identifier followed by shortened bit representation corresponding to each Unicode character in each cluster. The method may further comprise classifying the compressed text string into a set of clusters, wherein each cluster is identified based on a corresponding cluster identifier and the set of cluster types in the cluster table. The method may further comprise identifying a shortened bit representation and corresponding character table for each character in the cluster based on the cluster type applicable to the cluster. The method may further comprise generating a Unicode text string by representing each shortened bit representation in the cluster with a corresponding Unicode character, wherein the Unicode character is identified from the corresponding character table.

In one embodiment, a non-transitory computer readable medium embodying a program executable in a computing device for compression of text data is illustrated. The program comprises a program code for maintaining a set of character tables and a cluster table in a memory. In one embodiment, each character table may be configured to store a set of Unicode characters corresponding to a character class of a set of characters classes, wherein each Unicode character from the character table is assigned with a shortened bit representation. Further, the cluster table may be configured to maintain a set of cluster types and a cluster identifier corresponding to each of the cluster type, wherein each cluster type corresponds to a character class or a valid combination of two or more character classes represented by the set of character tables. The program may further comprise a program code for accepting an input text string comprising a combination of Unicode characters and classifying the input text string into a set of clusters based on the set of cluster types in the cluster table. In one embodiment, each cluster from the set of clusters may correspond to a Unicode character or a valid combination of two or more Unicode characters in the input text string. The program may further comprise a program code for identifying a cluster identifier, from the cluster table, corresponding to each cluster from the set of clusters. The program may further comprise a program code for identifying a shortened bit representation corresponding to each character, in each cluster, from the set of character tables. The program may further comprise a program code for generating a compressed text string, corresponding to the input text string, by representing each cluster with a corresponding cluster identifier followed by the shortened bit representation corresponding to each character in the cluster.

In one embodiment, a non-transitory computer readable medium embodying a program executable in a computing device for decompression of compressed text data is illustrated. The program comprises a program code for maintaining a set of character tables and a cluster table in a memory. In one embodiment, each character table may be configured to store a set of Unicode characters corresponding to a character class of a set of characters classes, wherein each Unicode character from the character table is assigned with a shortened bit representation. Further, the cluster table may be configured to maintain a set of cluster types and a cluster identifier corresponding to each of the cluster type, wherein each cluster type corresponds to a character class or a valid combination of two or more character classes represented by the set of character tables. The program may further comprise a program code for accepting a compressed text string, wherein the compressed text string is a set of clusters, wherein each cluster is represented with a cluster identifier followed by shortened bit representation corresponding to each Unicode character in each cluster. The program may further comprise a program code for classifying the compressed text string into a set of clusters, wherein each cluster is identified based on a corresponding cluster identifier and the set of cluster types in the cluster table. The program may further comprise a program code for identifying a shortened bit representation and corresponding character table for each character in the cluster based on the cluster type applicable to the cluster. The program may further comprise a program code for generating a Unicode text string by representing each shortened bit representation in the cluster with a corresponding Unicode character, wherein the Unicode character is identified from the corresponding character table.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

FIG. 8 illustrates compression of text data string in Devanagari script, in accordance with an embodiment of the present subject matter.

FIG. 9 illustrates decompression of text data string in Devanagari script, in accordance with an embodiment of the present subject matter.

FIG. 10 illustrates examples of Devanagari Script word with different cluster types applicable to at least one cluster in the word, in accordance with an embodiment of the present subject matter.

DETAILED DESCRIPTION

Figure 1:
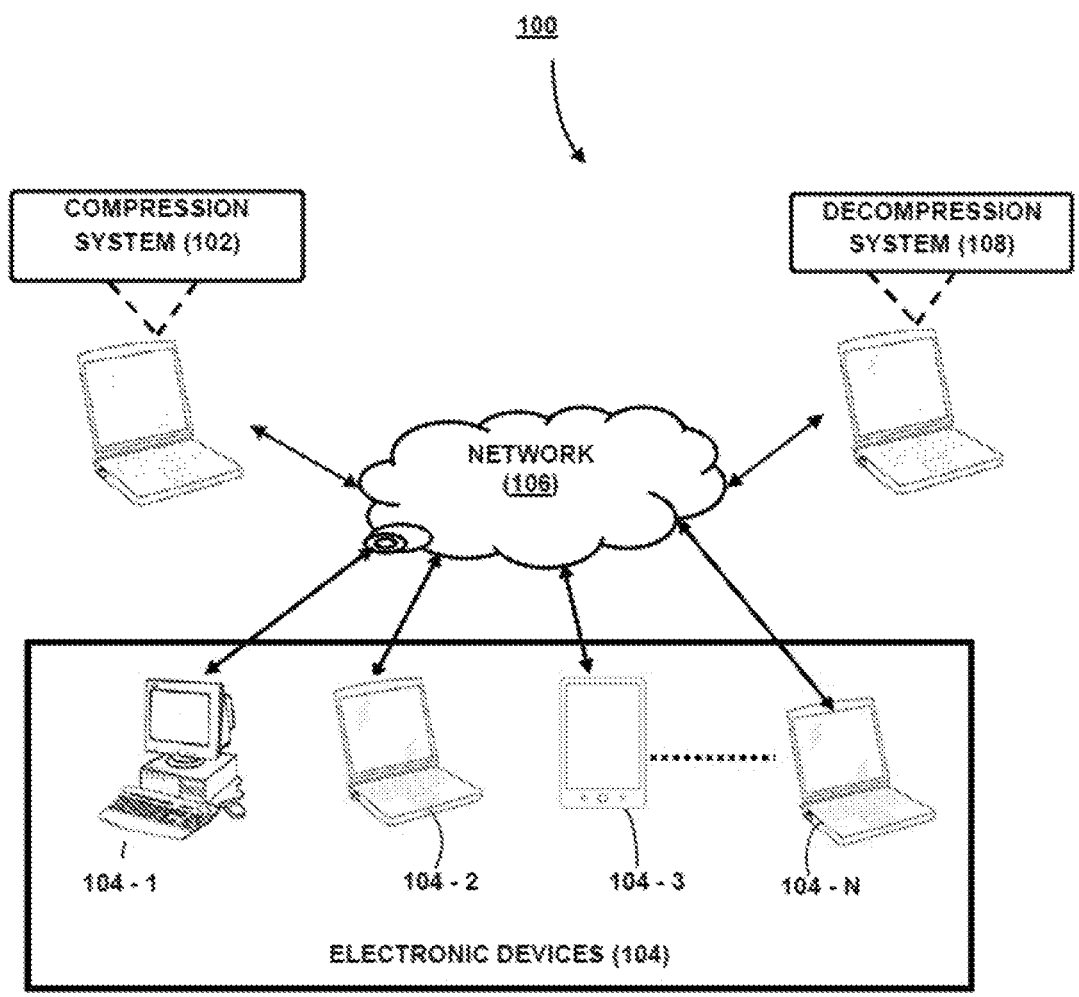
FIG. 1 illustrates a network implementation of a compression system and decompression system for compressing and decompressing of text data, in accordance with an embodiment of the present subject matter.

The present subject matter relates to systems for compression and decompression of text data. The method for compression and decompression may be implemented at two different systems namely the transmitter device and the receiver device. Alternately a single system may be enabled for performing the steps of compression and decompression of text data based on the type of the text data input provided.

In one embodiment, the transmitter system/compression system may be configured to compress text data of Devanagari Unicode characters before transmitting the text data to the receiver device/decompression system. The Devanagari Unicode characters are classified into a set of classes comprising Independent Vowels, Dependant Vowel Signs (Matra in Hindi), Consonants, Devanagari Sign Nukta (0x093C) characters and numbers. Further, the compression system is configured to generate a set of character tables for each of the classes from the set of classes such as a Vowel Table, a Matra Table, a Consonant Table and a Number_Nukta Table. Each character table is configured to maintain records of characters associated with the characters falling in the same class. Further, each record stores the Unicode value of the character, a character symbol and a shorten bit representation associated with the Unicode character. The shorten bit representation is in binary format. The shorten bit representation is used to replace the actual Unicode for the purpose of achieving compression. Further, the number of bits in the shorten bit representation for each character table may be different and is determined based on the number of characters in the character table representing a particular character class.

In one embodiment, the compression system is configured to maintain a cluster table. The cluster table is configured to maintain a set of cluster types and a cluster identifier corresponding to each of the cluster type. In one embodiment, each cluster type corresponds to a character class or a valid combination of two or more character classes represented by the set of character tables. The cluster types may be generated by analysing the language rules. For example, in most of the Indian languages, formation of a valid cluster is based on a set of predetermined rule (CNHCNHCNHC-NMD). In one embodiment, the 26 cluster types derived from predetermined rule (CNHCNHCNHCNMD) for Devanagari script are mentioned in table 7 and table 8. For Devanagari text the total number of cluster types considered is 26, wherein each cluster type is assigned with the header format/cluster identifier with predefined bit format. The length of the cluster identifier is variable and is based on the frequency of use of the cluster type. The frequency may be determined based on historically analyzed text data. In a similar manner, cluster tables for different languages can be derived and maintained for compression and decompression of text data in languages other than Indian languages.

Further, the compression system is configured to accept the input text string of Devanagari text. In one embodiment, the input text string may be accepted in the form of text file or in the form of text entered in a chatting/messaging application. Once the text string is accepted, in the next step, a line end marker like CR+LF is searched in input text string and the input text string is further divided into multiple chunks separated by CR+LF. These line chunks are further split into clusters. In one embodiment, clusters may be script grammar based group of characters in the words. The clusters may be in the form of various valid combinations of independent vowel, dependant vowel signs (matra) and consonants in based on Indian languages. Further, a cluster may be consisting of only vowel, only consonant, consonant plus matra or various combinations of consonants and matras. In a similar manner, various combinations of characters may be there in clusters. Further, the input text string may also comprise of bilingual text where English characters are used in between the Devanagari text.

In one embodiment, the compression system is configured to identify a cluster identifier, from the cluster table, corresponding to each cluster from the set of clusters that are identified from the input text string. Once the cluster identifier is identified, in the next step the compression system is configured to identify a shortened bit representation corresponding to each character, in each cluster, from the set of character tables. Further, the compression system is configured to generate a compressed text string, corresponding to the input text string, by representing each cluster with a corresponding cluster identifier followed by the shorten bit representation corresponding to each character in the cluster. The shorten bit representation are identified from the set of character tables. Once the compressed text string is generated, the compressed text string may be transmitted to a receiver device/decompression system.

In one embodiment, the set of character tables and the cluster table may be replicated at the decompression system and are used by the decompression system for decompression of the compressed text string. For the purpose of decompression, initially, the decompression system is configured to accept the compressed text string, wherein the compressed text string is a set of clusters represented with a cluster identifier followed by shortened bit representation corresponding to each Unicode character in each cluster.

Once the compressed text string is accepted, in the next step, decompression system is configured to classify the compressed text string into a set of clusters, wherein each cluster is identified based on a cluster identifier and the set of cluster types in the cluster table. Further, the decompression system is configured to identify a shortened bit representation and corresponding character table for each character in the cluster based on the cluster type applicable to the cluster. Further, the decompression system is configured to generate a Unicode text string by representing each shortened bit representation in the cluster with a corresponding Unicode character. The Unicode character is identified from the set of character tables.

While aspects of described system and method for compression and decompression of text data may be implemented in any number of different computing systems, environments, and/or configurations, the embodiments are described in the context of the following exemplary system.

Referring now to FIG. 1, a network implementation 100 of a compression system 102 and a decompression system 108 for compression and decompression of text data is disclosed. Although the present subject matter is explained considering that the compression system 102 and the decompression system 108 is implemented on a server, it may be understood that the compression system 102 and decompression system 108 may also be implemented in a variety of computing systems, such as a laptop computer, a desktop computer, a notebook, a handheld device, a workstation, a mainframe computer, a server, a network server, and the like. In one implementation, the compression system 102 and decompression system 108 may be implemented in a cloud-based environment. It will be understood that the compression system 102 and decompression system 108 may be accessed by multiple users through one or more user devices 104-1, 104-2 . . . 104-N, collectively referred to as user devices 104 hereinafter, or applications residing on the user devices 104. Examples of the user devices 104 may include, but are not limited to, a portable computer, a personal digital assistant, a handheld device, and a workstation. The user devices 104 are communicatively coupled to the compression system 102 and decompression system 108 through a network 106. The user devices may use the compression system 102 and decompression system 108 for compressing and decompressing text data.

In one implementation, the network 106 may be a wireless network, a wired network or a combination thereof. The network 106 can be implemented as one of the different types of networks, such as intranet, local area network (LAN), wide area network (WAN), the internet, and the like. The network 106 may either be a dedicated network or a shared network. The shared network represents an association of the different types of networks that use a variety of protocols, for example, Hypertext Transfer Protocol (HTTP), Transmission Control Protocol/Internet Protocol (TCP/IP), Wireless Application Protocol (WAP), and the like, to communicate with one another. Further the network 106 may include a variety of network devices, including routers, bridges, servers, computing devices, storage devices, and the like. The process of compressing an input text string by the compression system 102 is further elaborated with respect to FIG. 2.

Figure 2:
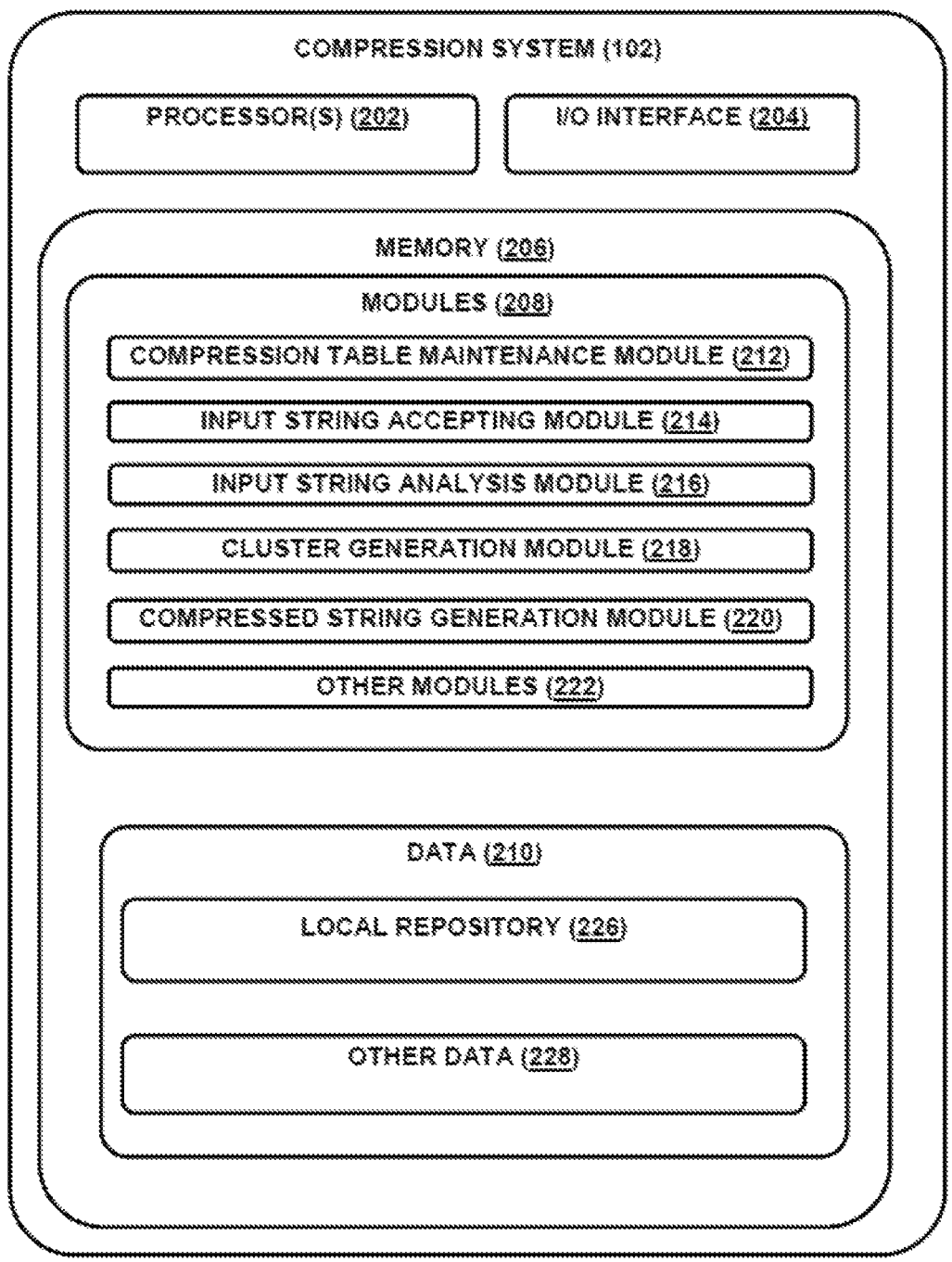
FIG. 2 illustrates the compression system for compressing the text data, in accordance with an embodiment of the present subject matter.

Referring now to FIG. 2, the compression system 102 is illustrated in accordance with an embodiment of the present subject matter. In one embodiment, the compression system 102 may include at least one processor 202, an input/output (I/O) interface 204, and a memory 206. The at least one processor 202 may be implemented as one or more microprocessors, microcomputers, microcontrollers, digital signal processors, central processing units, state machines, logic circuitries, and/or any devices that manipulate signals based on operational instructions. Among other capabilities, the at least one processor 202 is configured to fetch and execute computer-readable instructions stored in the memory 206.

The I/O interface 204 may include a variety of software and hardware interfaces, for example, a web interface, a graphical user interface, and the like. The I/O interface 204 may allow the compression system 102 to interact with a user directly or through the client devices 104. Further, the I/O interface 204 may enable the compression system 102 to communicate with other computing devices, such as web servers and external data servers (not shown) and the decompression system 108. The I/O interface 204 can facilitate multiple communications within a wide variety of networks and protocol types, including wired networks, for example, LAN, cable, etc., and wireless networks, such as WLAN, cellular, or satellite. The I/O interface 204 may include one or more ports for connecting a number of devices to one another or to another server.

The memory 206 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 206 may include modules 208 and data 210.

The modules 208 include routines, programs, objects, components, data structures, etc., which perform particular tasks, functions or implement particular abstract data types. In one implementation, the modules 208 may include a compression table maintenance module 212, an input string acceptance module 214, an input string analysis module 216, a cluster generation module 218, compressed string generation module 220, and other modules 222. The other modules 222 may include programs or coded instructions that supplement applications and functions of the compression system 102. The data 210, amongst other things, serves as a repository for storing data processed, received, and generated by one or more of the modules 208. The data 210 may also include a local repository 226, and other data 228.

In one embodiment, the local repository 226 is configured to maintain the tables generated by the compression table maintenance module 212. In one embodiment, the compression table maintenance module 212 is configured to generate a set of character tables and a cluster table. Each character table is configured to store a set of Unicode characters corresponding to a character class of a set of characters classes. The character classes are based on the language from which the classes are derived. For example, considering Brahmi script based languages, the character classes may include vowels, matra, consonant, and number_nukta. Further, each Unicode character from the character table is assigned with a shortened bit representation. Furthermore, the cluster table may be configured to maintain a set of cluster types and a cluster identifier corresponding to each of the cluster type, wherein each cluster type corresponds to a character class or a valid combination of two or more character classes represented by the set of character tables.

In one embodiment, the input string acceptance module 214 is configured to accept an input text string comprising a combination of Unicode characters. The combination may be in the form of valid words in any Indian language. The input text string may also comprise valid English words or numbers. Further, the input string analysis module 216 is configured to classify the input text string into a set of clusters based on the set of cluster types in the cluster table. In one embodiment, each cluster may correspond to a Unicode character or a valid combination of two or more Unicode characters in the input text string. The valid combination is determined based on the cluster type CNHCN- HCNHCNMD (C—Consonant, N—Nukta Character, H—Halant, M—Matra, and D—Diacritic).

In one embodiment, the cluster generation module 218 is configured to identify a cluster identifier, from the cluster table, corresponding to each cluster from the set of clusters in the input text string. Further, the compressed string generation module 220 is configured to identify a shortened bit representation corresponding to each character, in each cluster, from the set of character tables and generate a compressed text string, corresponding to the input text string. In one embodiment the compressed text string is generated by the compressed string generation module 220 by representing each cluster with a corresponding cluster identifier followed by the shortened bit representation corresponding to each character in the cluster. The representation may be in the form of bits corresponding to each cluster identifier and shorten bit representation of the characters in the cluster. In one embodiment, the cluster is represented by bit value of the cluster identifier followed by the bit value (shortened bit representation) corresponding to each character in the cluster. Once the compressed text string is generated, in the next step, the compressed text string is stored for further use and/or transmitted/sent to the decompression system 108. The process of decompressing the compressed text string by the decompression system 108 is further elaborated with respect to FIG. 3.

Figure 3:
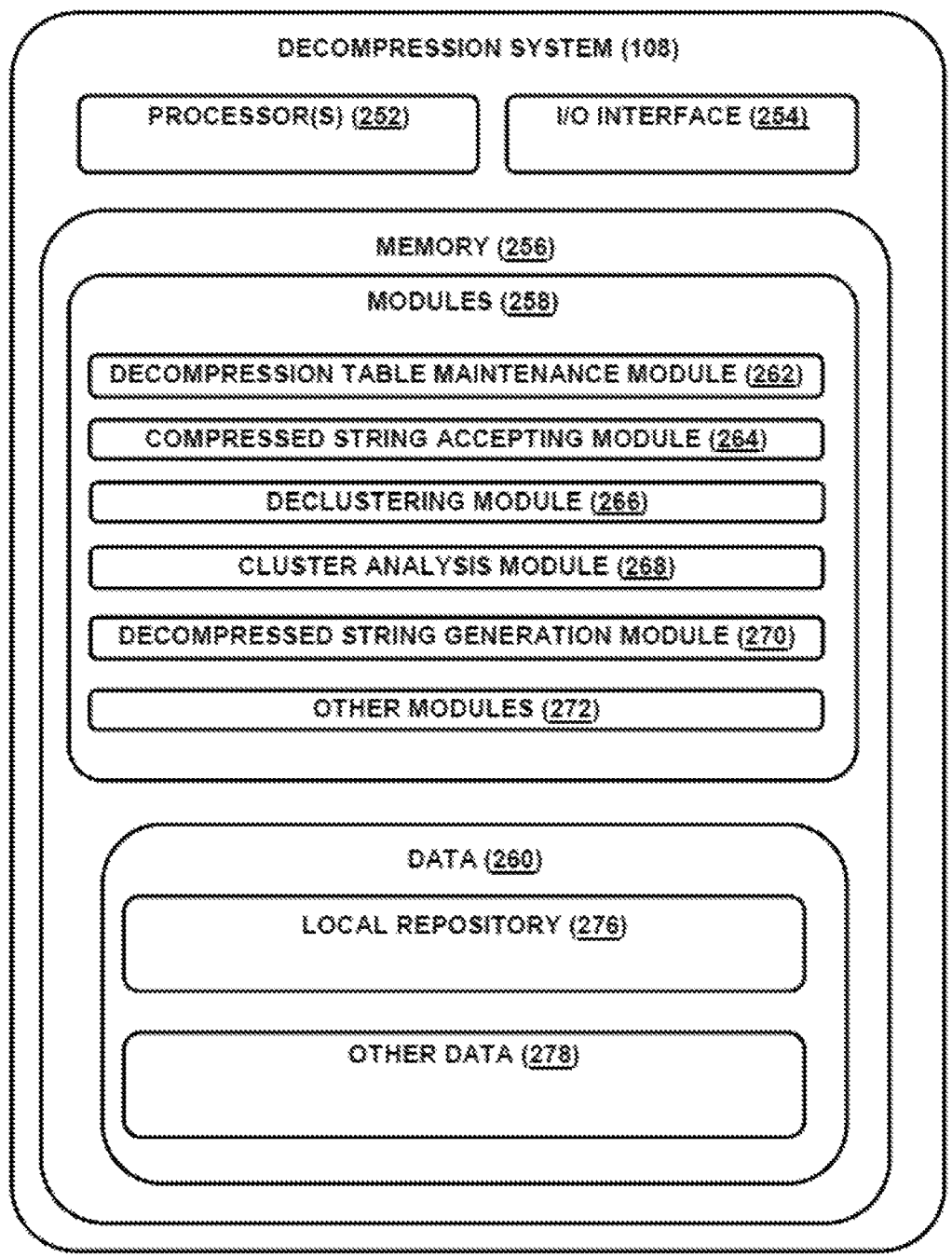
FIG. 3 illustrates the decompression system for decompressing a compressed text data, in accordance with an embodiment of the present subject matter.

Referring now to FIG. 3, the decompression system 108 is illustrated in accordance with an embodiment of the present subject matter. In one embodiment, the decompression system 108 may include at least one processor 252, an input/output (I/O) interface 254, and a memory 256. The at least one processor 252 may be implemented as one or more microprocessors, microcomputers, microcontrollers, digital signal processors, central processing units, state machines, logic circuitries, and/or any devices that manipulate signals based on operational instructions. Among other capabilities, the at least one processor 252 is configured to fetch and execute computer-readable instructions stored in the memory 256.

The I/O interface 254 may include a variety of software and hardware interfaces, for example, a web interface, a graphical user interface, and the like. The I/O interface 254 may allow the compression system 102 to interact with a user directly or through the client devices 104. Further, the I/O interface 254 may enable the decompression system 108 to communicate with other computing devices, such as web servers and external data servers (not shown) and the decompression system 108. The I/O interface 254 can facilitate multiple communications within a wide variety of networks and protocol types, including wired networks, for example, LAN, cable, etc., and wireless networks, such as WLAN, cellular, or satellite. The I/O interface 254 may include one or more ports for connecting a number of devices to one another or to another server.

The memory 256 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. The memory 256 may include modules 258 and data 260.

The modules 258 include routines, programs, objects, components, data structures, etc., which perform particular tasks, functions or implement particular abstract data types. In one implementation, the modules 258 may include a decompression table maintenance module 262, a compressed string accepting module 264, a de-clustering module 266, cluster analysis module 268, a decompressed string generation module 270, and other modules 272. The other modules 272 may include programs or coded instructions that supplement applications and functions of the decompression system 108. The data 260, amongst other things, serves as a repository for storing data processed, received, and generated by one or more of the modules 258. The data 260 may also include a local repository 276, and other data 278.

In one embodiment, the local repository 276 is configured to maintain the tables generated by the decompression table maintenance module 262. In one embodiment, the decompression table maintenance module 262 is configured to generate a set of character tables and a cluster table. The set of character tables and a cluster table are same at that used by the compression system 102 for compression the input text string for generating the compressed text string.

In one embodiment, the compressed string acceptance module 264 is configured to accept the compressed text string. The compressed text string is a set of clusters, wherein each cluster is represented with a cluster identifier followed by shortened bit representation corresponding to each Unicode character in the cluster. In other words, in decompression cycle, the cluster is represented by a sequence of bits, the first few bits correspond to the cluster identifier and the remaining bits correspond to the shorten bit representation corresponding to all the character in the cluster.

Once the compressed text string is accepted, in the next step, the de-clustering module 266 is configured to classify the compressed text string into a set of clusters, wherein each cluster is identified based on a corresponding cluster identifier and the set of cluster type in the cluster table.

Further, the cluster analysis module 268 is configured to identify a shortened bit representation and corresponding character table for each character in the cluster based on the cluster type applicable to the cluster. Further, the de-compressed string generation module 270 is configured to generate a Unicode text string by representing each shortened bit representation in the cluster with a corresponding Unicode character, wherein the Unicode character is identified from the corresponding character table. The method for compressing the input text string by the compression system 102 is further elaborated with respect to the flow diagram of FIG. 4.

Figure 4:
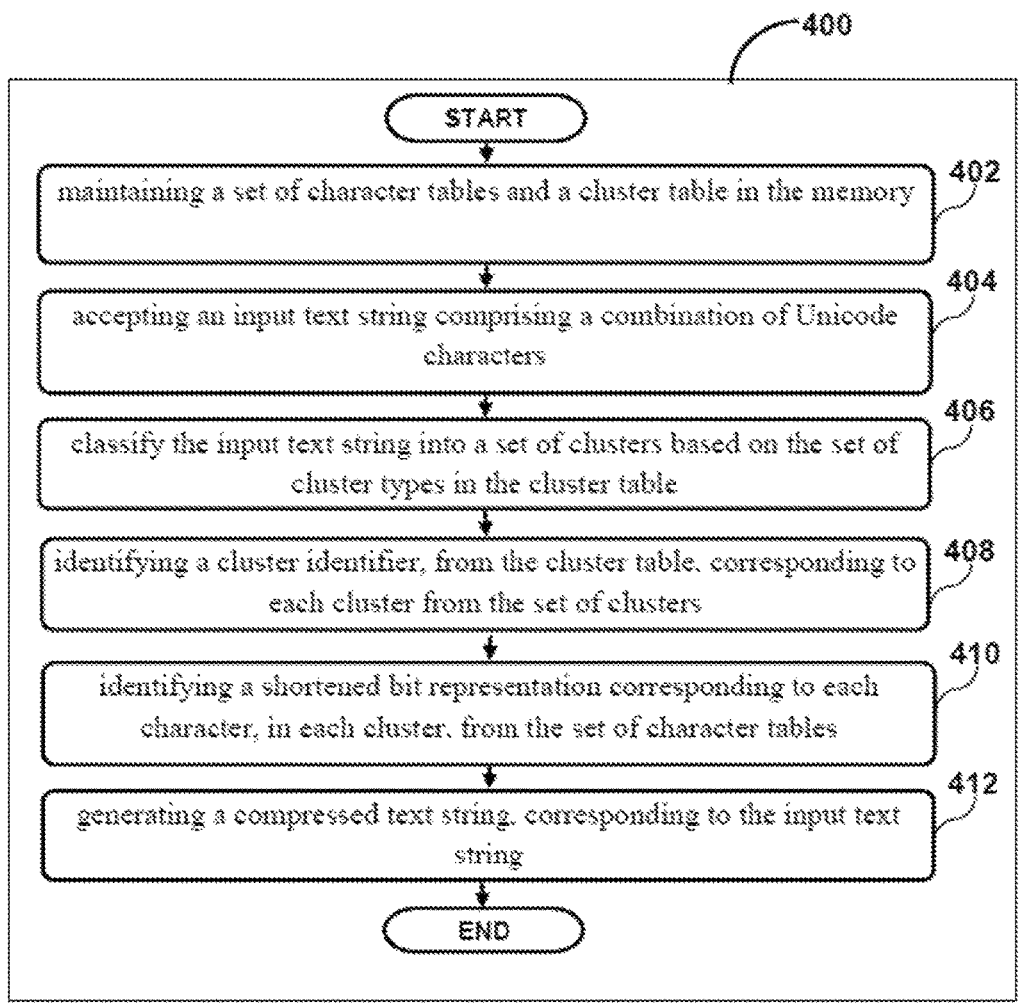
FIG. 4 illustrates a flow diagram for compressing the text data using the compression system, in accordance with an embodiment of the present subject matter.

Referring now to FIG. 4, a method 400 for compressing text data string is disclosed, in accordance with an embodiment of the present subject matter. The method 400 may be described in the general context of computer executable instructions. Generally, computer executable instructions can include routines, programs, objects, components, data structures, procedures, modules, functions, and the like, that perform particular functions or implement particular abstract data types. The method 400 may also be practiced in a distributed computing environment where functions are performed by remote processing devices that are linked through a communications network. In a distributed computing environment, computer executable instructions may be located in both local and remote computer storage media, including memory storage devices.

The order in which the method 400 is described is not intended to be construed as a limitation, and any number of the described method blocks can be combined in any order to implement the method 400 or alternate methods. Additionally, individual blocks may be deleted from the method 400 without departing from the spirit and scope of the subject matter described herein. Furthermore, the method 400 can be implemented in any suitable hardware, software, firmware, or combination thereof. However, for ease of explanation, in the embodiments described below, the method 400 may be considered to be implemented in the above described compression system 102.

At block 402, the compression table maintenance module 212 is configured to generate a set of character tables and a cluster table. Each character table is configured to store a set of Unicode characters corresponding to a character class of a set of characters classes. The character classes are based on the language from which the classes are derived. For example, considering Brahmi script based languages, the character classes may include vowels, matra, consonant, and number_nukta. Further, each Unicode character from the character table is assigned with a shortened bit representation. Furthermore, the cluster table is configured to maintain a set of cluster types and a cluster identifier corresponding to each of the cluster type. Each cluster type corresponds to a character class or a valid combination of two or more character classes represented by the set of character tables.

At block 404, the input string acceptance module 214 is configured to accept an input text string comprising a combination of Unicode characters. The combination may be in the form of valid words in any Indian language. The input text string may also comprise valid English words or numbers.

At block 406, the input string analysis module 216 is configured to classify the input text string into a set of clusters based on the set of cluster types in the cluster table. In one embodiment, each cluster may correspond to a Unicode character or a valid combination of two or more Unicode characters in the input text string.

At block 408, the cluster generation module 218 is configured to identify a cluster identifier, from the cluster table, corresponding to each cluster from the set of clusters in the input text string.

At block 410, the compressed string generation module 220 is configured to identify a shortened bit representation corresponding to each character, in each cluster, from the set of character tables and generate a compressed text string, corresponding to the input text string. In one embodiment the compressed text string is generated by the compressed string generation module 220 by representing each cluster with a corresponding cluster identifier followed by the shortened bit representation corresponding to each character in the cluster. Once the compressed text string is generated, in the next step, the compressed text string is stored for further use and/or transmitted/sent to the decompression system 108. The method for decompressing the compressed text string by the decompression system 108 is further elaborated with respect to the flow diagram of FIG. 5.

Figure 5:
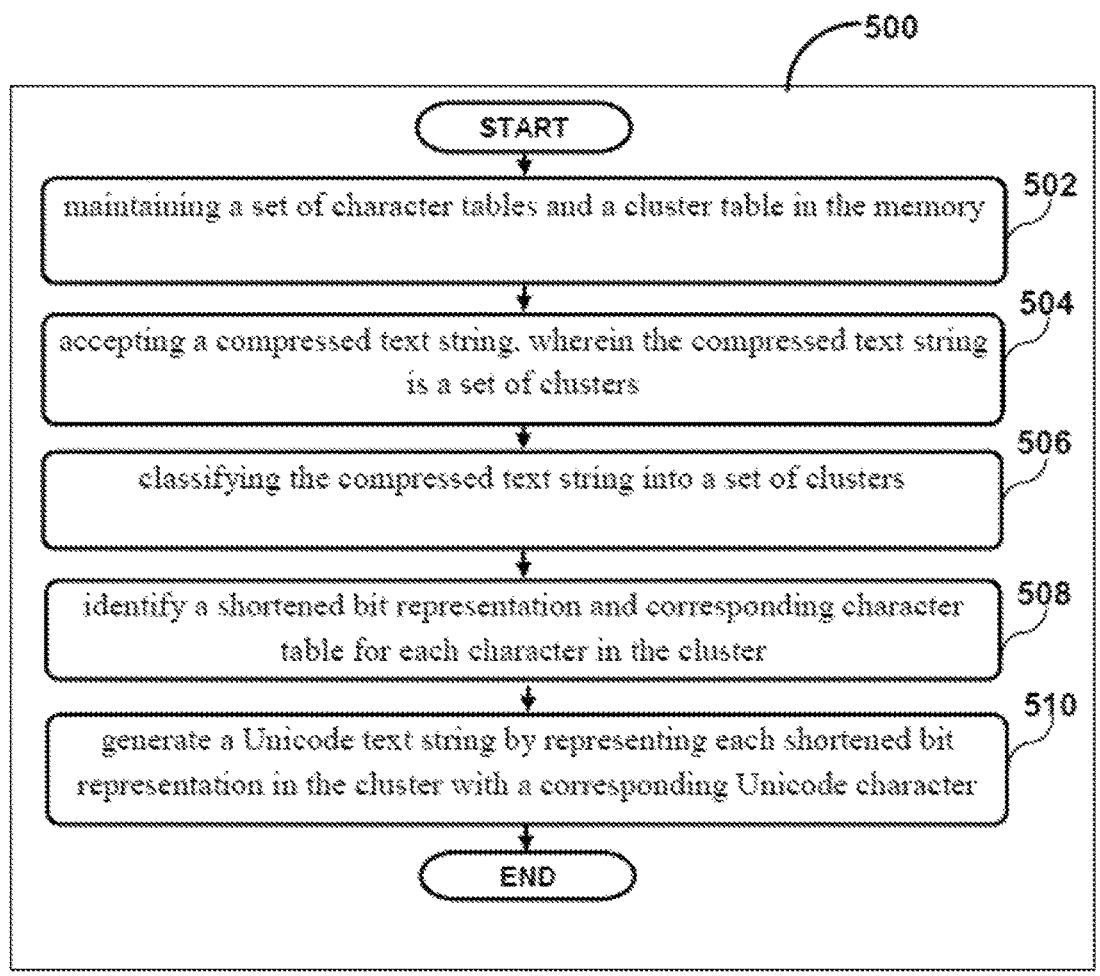
FIG. 5 illustrates a flow diagram for decompressing the compressed text data using the decompression system, in accordance with an embodiment of the present subject matter.

Referring now to FIG. 5, a method 500 for decompressing the compressed text string is disclosed, in accordance with an embodiment of the present subject matter. The method 500 may be described in the general context of computer executable instructions. Generally, computer executable instructions can include routines, programs, objects, components, data structures, procedures, modules, functions, and the like, that perform particular functions or implement particular abstract data types. The method 500 may also be practiced in a distributed computing environment where functions are performed by remote processing devices that are linked through a communications network. In a distributed computing environment, computer executable instructions may be located in both local and remote computer storage media, including memory storage devices.

The order in which the method 500 is described is not intended to be construed as a limitation, and any number of the described method blocks can be combined in any order to implement the method 500 or alternate methods. Additionally, individual blocks may be deleted from the method 500 without departing from the spirit and scope of the subject matter described herein. Furthermore, the method 500 can be implemented in any suitable hardware, software, firmware, or combination thereof. However, for ease of explanation, in the embodiments described below, the method 500 may be considered to be implemented in the above described decompression system 108.

At block 502, the decompression table maintenance module 262 is configured to generate a set of character tables and a cluster table. The set of character tables and a cluster table are same at that used by the compression system 102 for compression the input text string for generating the compressed text string.

At block 504, the compressed string acceptance module 264 is configured to accept the compressed text string. The compressed text string is a set of clusters, wherein each cluster is represented with a cluster identifier followed by shortened bit representation corresponding to each Unicode character in each cluster.

At block 506, once the compressed text string is accepted, in the next step, the de-clustering module 266 is configured to classify the compressed text string into a set of clusters, wherein each cluster is identified based on a corresponding cluster identifier and the set of cluster types in the cluster table.

At block 508, the cluster analysis module 268 is configured to identify a shortened bit representation and corresponding character table for each character in the cluster based on the cluster type applicable to the cluster.

At block 510, the de-compressed string generation module 270 is configured to generate a Unicode text string by representing each shortened bit representation in the cluster with a corresponding Unicode character, wherein the Unicode character is identified from the corresponding character table.

EXAMPLE OF IMPLEMENTATION

In one example, the process for compression and decompression of text data in Devanagari script using the compression system 102 and the decompression system 108 is disclosed as below.

For the purpose of compression, initially, the compression system 102 is configured to maintain a set of character tables and the cluster table corresponding to the Devanagari script. The Devanagari Unicode characters are first classified into a set of classes. These classes consisting of Vowel, Matra, Consonant, Nukta characters and numbers. In the next step, the compression table maintenance module 212 is configured to create one character table corresponding to each class from the set of classes. For the Devanagari Unicode characters, the character tables include a Vowel Table, a Matra Table, a Consonant Table, a Number_Nukta Table and an English character Table. Each of the record in the character tables contain 3 values, namely a symbol of the character, a Unicode value of the character, and a shorten bit representation of the character. The number of bits allocated for the shortened bit representation corresponding to each table is based on the total number of characters in the character table. The content of each of the character tables is mentioned as below:

Vowel Table containing 12 vowels, 2 matras, a dot and a space.

Matra Table containing remaining 16 matras.

Consonant Table containing 32 frequently used Consonants.

Number_Nukta Table containing total of 64 characters comprising remaining consonants, numbers, nukta characters and symbols.

English Table containing 26+26+10 English characters for supporting bilingual text (Indian Language+English)

The bits allocated for shorten bit representation corresponding to each of the character table is shown in table 1.

TABLE 1

Bits allocated for shorten bit representation corresponding to each of the character table

| Character Tables | Number of bits allocated for shorten bit representation of each character in character table |
|---|---|
| Vowel Table (with 16 characters) | 4 Bits |
| Matra Table (with 16 characters) | 4 Bits |
| Consonant Table (with 32 characters) | 5 Bits |
| Number_Nukta Table (with 64 characters) | 6 Bits |
| English Table (with 64 characters) | 6 Bits |

In one embodiment, as represented in table 1, 4 bits are assigned for shorten bit representation of each character in the vowel table. Hence, a maximum 16 characters can be represented using the 4 bits. In one embodiment, for Devanagari script, 12 vowels are included in the Vowel Table. The remaining 4 locations are used for a space, a dot and two less frequently used matras ('Nukta' and 'Tilda') from the total 18 matras in the Devanagari script. The table 2 represents the vowel table maintained in the current example.

TABLE 2

Vowel (independent vowels) table in Devanagari script.

| Symbol | Unicode representation | Shorten bit representation |
|---|---|---|
| अ | 0x0905 | 0000 |
| आ | 0x0906 | 0001 |
| इ | 0x0907 | 0010 |
| ई | 0x0908 | 0011 |
| उ | 0x0909 | 0100 |
| ऊ | 0x090a | 0101 |
| ऍ | 0x090d | 0110 |
| ए | 0x090f | 0111 |
| ऐ | 0x0910 | 1000 |
| ऑ | 0x0911 | 1001 |
| ओ | 0x0913 | 1010 |
| औ | 0x0914 | 1011 |
| ् | 0x093c | 1100 |
| ऽ | 0x093d | 1101 |
| .(Dot) | 0x002e | 1110 |
| Space | 0x0020 | 1111 |

In one embodiment, the matra table with remaining 16 matras is generated by the compression table maintenance module 212. In one embodiment 4 bits are allocated to represent the 16 matras. The table 3 represents the matra table maintained in the current example.

TABLE 3

Matra (dependant vowels) table in Devanagari script.

| Symbol | Unicode representation | Shorten bit representation |
|---|---|---|
| ा | 0x093e | 0000 |
| ि | 0x093f | 0001 |
| ी | 0x0940 | 0010 |
| ु | 0x0941 | 0011 |
| ू | 0x0942 | 0100 |
| ृ | 0x0943 | 0101 |
| ॅ | 0x0945 | 0110 |
| े | 0x0947 | 0111 |
| ै | 0x0948 | 1000 |
| ॉ | 0x0949 | 1001 |
| ॊ | 0x094b | 1010 |
| ो | 0x094c | 1011 |
| ् | 0x094d | 1100 |
| ं | 0x0901 | 1101 |
| ं | 0x0902 | 1110 |
| ः | 0x0903 | 1111 |

In one embodiment, the consonants table with 32 frequently used Consonants out of the total 41 Consonants is generated using 5 bit representation. In one embodiment 5 bits are allocated to represent the 32 frequently used Consonants. The table 4 represents the Consonant table maintained in the current example.

TABLE 4

Consonant table in Devanagari script.

| Symbol | Unicode representation | Shorten bit representation |
|---|---|---|
| क | 0x0915 | 00000 |
| ख | 0x0916 | 00001 |
| ग | 0x0917 | 00010 |
| घ | 0x0918 | 00011 |
| च | 0x091a | 00100 |
| छ | 0x091b | 00101 |
| ज | 0x091c | 00110 |
| झ | 0x091d | 00111 |
| ट | 0x091f | 01000 |
| ठ | 0x0920 | 01001 |
| ड | 0x0921 | 01010 |
| ढ | 0x0922 | 01011 |
| ण | 0x0923 | 01100 |
| त | 0x0924 | 01101 |
| थ | 0x0925 | 01110 |
| द | 0x0926 | 01111 |
| ध | 0x0927 | 10000 |
| न | 0x0928 | 10001 |
| प | 0x092a | 10010 |
| फ | 0x092b | 10011 |
| ब | 0x092c | 10100 |
| भ | 0x092d | 10101 |
| म | 0x092e | 10110 |
| य | 0x092f | 10111 |
| र | 0x0930 | 11000 |
| ल | 0x0932 | 11001 |
| ळ | 0x0933 | 11010 |
| व | 0x0935 | 11011 |
| श | 0x0936 | 11100 |
| ष | 0x0937 | 11101 |
| स | 0x0938 | 11110 |
| ह | 0x0939 | 11111 |

In one embodiment, the Number_Nukta Table with Devanagari script numbers, remaining 9 consonants, and punctuation marks from ASCII table is generated. In one embodiment 6 bits are allocated to represent the 64 characters in the Number_Nukta Table.

In a similar manner, the English table is created with 26 capital English alphabets, 26 small alphabets, and 10 decimal digits. The table 5 represents the Number_Nukta Table maintained in the current example. The table 6 represents the English Table maintained in the current example.

TABLE 5

Number_Nukta (Unicode Sign Nukta and numbers) Table in Devanagari script

| Symbol | Unicode representation | Shorten bit representation |
|---|---|---|
| ० | 0x0966 | 000000 |
| १ | 0x0967 | 000001 |
| २ | 0x0968 | 000010 |
| ३ | 0x0969 | 000011 |
| ४ | 0x096a | 000100 |
| ५ | 0x096b | 000101 |
| ६ | 0x096c | 000110 |
| ७ | 0x096d | 000111 |
| ८ | 0x096e | 001000 |
| ९ | 0x096f | 001001 |
| ऩ | 0x0929 | 001010 |
| ऴ | 0x0934 | 001011 |
| क़ | 0x0958 | 001100 |
| ख़ | 0x0959 | 001101 |
| ग़ | 0x095a | 001110 |
| ज़ | 0x095b | 001111 |
| ड़ | 0x095c | 010000 |
| ढ़ | 0x095d | 010001 |
| फ़ | 0x095e | 010010 |
| य़ | 0x095f | 010011 |
| ঙ | 0x0919 | 010100 |
| ऱ | 0x0931 | 010101 |
| ञ | 0x091e | 010110 |
| ऌ | 0x090c | 010111 |
| ॡ | 0x0961 | 011000 |
| ॢ | 0x0962 | 011001 |
| ॣ | 0x0963 | 011010 |
| ॄ | 0x0944 | 011011 |
| ॠ | 0x0960 | 011100 |
| ₹ | 0x20B9 | 011101 |
| । | 0x0964 | 011110 |
| ॥ | 0x0965 | 011111 |
| ॲ | 0x0972 | 100000 |
| ॰ | 0x0970 | 100001 |
| ऄ | 0x0904 | 100010 |
| ऎ | 0x090E | 100011 |
| ॐ | 0x0950 | 100100 |
| ऋ | 0x090b | 100101 |
| ! | 0x0021 | 100110 |
| " | 0x0022 | 100111 |
| # | 0x0023 | 101000 |
| $ | 0x0024 | 101001 |
| % | 0x0025 | 101010 |
| & | 0x0026 | 101011 |
| ' | 0x0027 | 101100 |
| ( | 0x0028 | 101101 |
| ) | 0x0029 | 101110 |
| * | 0x002a | 101111 |
| + | 0x002b | 110000 |
| , | 0x002c | 110001 |
| - | 0x002d | 110010 |
| / | 0x002f | 110011 |
| : | 0x003a | 110100 |
| ; | 0x003b | 110101 |
| < | 0x003c | 110110 |
| = | 0x003d | 110111 |
| > | 0x003e | 111000 |
| ? | 0x003f | 111001 |
| [ | 0x005b | 111010 |
| \ | 0x005c | 111011 |
| ] | 0x005d | 111100 |

TABLE 5-continued

Number_Nukta (Unicode Sign Nukta and numbers) Table in Devanagari script

| Symbol | Unicode representation | Shorten bit representation |
|---|---|---|
| ^ | 0x005e | 111101 |
| _ (underscore) | 0x005f | 111110 |
| @ | 0x0040 | 111111 |

TABLE 6

English Table

| Symbol | Unicode representation | Shorten bit representation |
|---|---|---|
| A | 0x0041 | 000000 |
| B | 0x0042 | 000001 |
| C | 0x0043 | 000010 |
| D | 0x0044 | 000011 |
| E | 0x0045 | 000100 |
| F | 0x0046 | 000101 |
| G | 0x0047 | 000110 |
| H | 0x0048 | 000111 |
| I | 0x0049 | 001000 |
| J | 0x004a | 001001 |
| K | 0x004b | 001010 |
| L | 0x004c | 001011 |
| M | 0x004d | 001100 |
| N | 0x004e | 001101 |
| O | 0x004f | 001110 |
| P | 0x0050 | 001111 |
| Q | 0x0051 | 010000 |
| R | 0x0052 | 010001 |
| S | 0x0053 | 010010 |
| T | 0x0054 | 010011 |
| U | 0x0055 | 010100 |
| V | 0x0056 | 010101 |
| W | 0x0057 | 010110 |
| X | 0x0058 | 010111 |
| Y | 0x0059 | 011000 |
| Z | 0x005a | 011001 |
| a | 0x0061 | 011010 |
| b | 0x0062 | 011011 |
| c | 0x0063 | 011100 |
| d | 0x0064 | 011101 |
| e | 0x0065 | 011110 |
| f | 0x0066 | 011111 |
| g | 0x0067 | 100000 |
| h | 0x0068 | 100001 |
| i | 0x0069 | 100010 |
| j | 0x006a | 100011 |
| k | 0x006b | 100100 |
| l | 0x006c | 100101 |
| m | 0x006d | 100110 |
| n | 0x006e | 100111 |
| o | 0x006f | 101000 |
| p | 0x0070 | 101001 |
| q | 0x0071 | 101010 |
| r | 0x0072 | 101011 |
| s | 0x0073 | 101100 |
| t | 0x0074 | 101101 |
| u | 0x0075 | 101110 |
| v | 0x0076 | 101111 |
| w | 0x0077 | 110000 |
| x | 0x0078 | 110001 |
| y | 0x0079 | 110010 |
| z | 0x007a | 110011 |
| 0 | 0x0030 | 110100 |
| 1 | 0x0031 | 110101 |
| 2 | 0x0032 | 110110 |
| 3 | 0x0033 | 110111 |
| 4 | 0x0034 | 111000 |
| 5 | 0x0035 | 111001 |
| 6 | 0x0036 | 111010 |

TABLE 6-continued

English Table

| Symbol | Unicode representation | Shorten bit representation |
|---|---|---|
| 7 | 0x0037 | 111011 |
| 8 | 0x0038 | 111100 |
| 9 | 0x0039 | 111101 |
|   |        | 111110 |
|   |        | 111111 |

The compression system 102 is configured for using the set of character tables and a cluster types represented in the cluster table to generate a compressed text string from the input text string in Unicode format. The cluster types are based on script grammar for Devanagari script. For the purpose of generating the cluster table, initially the compression system 102 is configured to identify a set of cluster types associated with the Devanagari script. The cluster types define a valid combination of characters classes represented by the character tables. In all there are 26 valid combination (cluster types) listed as below.

1] Vowel Only
2] Consonant Only
3] Consonant + Matra
4] Consonant + Matra + Matra
5] Consonant + Halant + Consonant
6] Consonant + Halant + Consonant + Matra
7] Consonant + Halant + Consonant + Matra + Matra
8] Numbers/NuktaChar/Symbol/Punctuation
9] EnglishChar
10] UnicodeAs_It_Is
11] Lang_7Bit
12] Vowel + Matra
13] Consonant + Sp. Matra
14] NuktaChar + Matra
15] Consonant + Halant + NuktaChar
16] NuktaChar + Halant + Consonant
17] Consonant + Sp. Matra + Matra
18] Consonant + Halant + NuktaChar + Matra
19] NuktaChar + Halant + Consonant + Matra
20] Consonant + Halant + Consonant + Sp. Matra
21] Consonant + Halant + NuktaChar + Matra + Matra
22] NuktaChar + Halant + Consonant + Matra + Matra
23] Consonant + Halant + Consonant + Halant + Consonant
24] Consonant + Halant + Consonant + Sp. Matra + Matra
25] Consonant + Halant + Consonant + Halant + Consonant + Matra
26] Consonant + Halant + Consonant + Halant + Consonant + Matra + Matra Halant is a matra represented by 4 bits, but for easy understanding of combination it is written as halant.

In one embodiment, the cluster types are used for generating the cluster table. The cluster table comprises a cluster identifier with variable length. The variable length is based on the frequency of occurrence of the clusters in any text files. If the frequency of occurrence is high, the length of the cluster identifier is kept minimum and vice-versa. The cluster identifier provides identification mark for compression and decompression of the text data. Against every cluster identifier there are fixed bit format associated, which represents bit format for completing cluster. For example H11, cluster identifier is "00" indicating vowel only case and followed by only 4 bits representing actual vowel. H14, cluster identifier is "11,000" indicating 'consonant+halanta+consonant' cluster type and followed by '5+4+5' bits (shorten bit representation of the Unicode characters). H28, cluster identifier is "11,111,000" indicating 'consonant+halanta+consonant+halanta+consonant' cluster type and followed by '5+4+5+4+5' bits (shorten bit representation of the Unicode characters). The different cluster types, cluster identifier and bit allocation information is represented in the cluster table. Further, the cluster table also maintains the total length, in bits, required to represent the cluster identifier as well as the shorten bit representation of each character in the cluster. The table 7 represents cluster table generated for Devanagari script.

TABLE 7

Cluster table for Devanagari script

| Sr. No. | Case | Variable Length Cluster Identifier | Cluster types | Total bits required for representing each character in the cluster (Cluster Identifier + shorten bit representation of characters in the cluster) |
|---|---|---|---|---|
| 1 | H11 | 00 | Vowel Only | 2 + 4 = 6 |
| 2 | H12 | 01 | Consonant Only | 2 + 5 = 7 |
| 3 | H13 | 10 | Consonant + Matra | 2 + 5 + 4 = 11 |
| 4 | H21 | 11000 | Consonant + Matra + Matra | 5 + 5 + 4 + 4 = 18 |
| 5 | H22 | 11001 | Consonant + Halant + Consonant | 5 + 5 + 4 + 5 = 19 |
| 6 | H23 | 11010 | Consonant + Halant + Consonant + Matra | 5 + 5 + 4 + 5 + 4 = 23 |
| 7 | H24 | 11011 | Consonant + Halant + Consonant + Matra + Matra | 5 + 5 + 4 + 5 + 4 + 4 = 27 |
| 8 | H25 | 11100 | Numbers/NuktaChar/Symbol/Punctuation | 5 + 6 = 11 |
| 9 | H26 | 11101 | EnglishChar | 5 + 6 = 11 |
| 10 | H27 | 11110 | UnicodeAs_It_Is | 5 + 16 = 21 |
| 11 | H31 | 111110000 | Lang_7Bit | 9 + 7 = 16 |
| 12 | H32 | 111110001 | Vowel + Matra | 9 + 4 + 4 = 17 |
| 13 | H33 | 111110010 | Consonant + Sp. Matra | 9 + 5 + 4 = 18 |

TABLE 7-continued

Cluster table for Devanagari script

| Sr. No. | Case | Variable Length Cluster Identifier | Cluster types | Total bits required for representing each character in the cluster (Cluster Identifier + shorten bit representation of characters in the cluster) |
|---|---|---|---|---|
| 14 | H34 | 111110011 | NuktaChar + Matra | 9 + 6 + 4 = 19 |
| 15 | H35 | 111110100 | Consonant + Halant + NuktaChar | 9 + 5 + 4 + 6 = 24 |
| 16 | H36 | 111110101 | NuktaChar + Halant + Consonant | 9 + 6 + 4 + 5 = 24 |
| 17 | H37 | 111110110 | Consonant + Sp. Matra + Matra | 9 + 5 + 4 + 4 = 22 |
| 18 | H38 | 111110111 | Consonant + Halant + NuktaChar + Matra | 9 + 5 + 4 + 6 + 4 = 28 |
| 19 | H39 | 111111000 | NuktaChar + Halant + Consonant + Matra | 9 + 6 + 4 + 5 + 4 = 28 |
| 20 | H3A | 111111001 | Consonant + Halant + Consonant + Sp. Matra | 9 + 5 + 4 + 5 + 4 = 27 |
| 21 | H3B | 111111010 | Consonant + Halant + NuktaChar + Matra + Matra | 9 + 5 + 4 + 6 + 4 + 4 = 32 |
| 22 | H3C | 111111011 | NuktaChar + Halant + Consonant + Matra + Matra | 9 + 6 + 4 + 5 + 4 + 4 = 32 |
| 23 | H3D | 111111100 | Consonant + Halant + Consonant + Halant + Consonant | 9 + 5 + 4 + 5 + 4 + 5 = 32 |
| 24 | H3E | 111111101 | Consonant + Halant + Consonant + Sp. Matra + Matra | 9 + 5 + 4 + 5 + 4 + 4 = 31 |
| 25 | H3F | 111111110 | Consonant + Halant + Consonant + Halant + Consonant + Matra | 9 + 5 + 4 + 5 + 4 + 5 + 4 = 36 |
| 26 | H40 | 111111111 | Consonant + Halant + Consonant + Halant + Consonant + Matra + Matra | 9 + 5 + 4 + 5 + 4 + 5 + 4 + 4 = 40 |

In one embodiment, three categories of cluster identifiers are defined to categorize different cluster types. First category of cluster identifier is of only 2 bits in length, hence 4 different combination/cases can be accommodate. Second category of cluster identifier is of 3 bits in length and can accommodate 8 cases. Third category of cluster identifier is of 4 bits in length and can accommodate 16 cases. Hence, a total of 26 cases are accommodated in the above cluster table. For the formation of each compressed word one or more cluster identifier may be required based on the cluster types applicable to the word. The first category of cluster identifier has 2 bits in total, representing the 4 cases. The second category of cluster identifier has 5 bits in total, wherein the first 2 bits are 11 (taken from the first category 'case 4') followed by 3 bits repressing the 8 cases. Similarly, the third category of cluster identifier has 9 bits in total, wherein the first 5 bits are 11111 (taken from the second category 'case 8') followed by 4 bits repressing the 16 cases.

The cluster identifiers are used for building a compressed text string as well as to decompress the already compressed string. Further, the cluster table also maintains the total length of the cluster for each cluster type. The cluster identifier is also used to identify cluster boundary at the time of decompression of compressed text string. The total length of the cluster is computed based on fix number of bit format corresponding to each type of character class in the cluster. This bit format completes one cluster representation.

For example, consider the case H11 from table 7. H11 is vowel only case. Vowel is represented by only 4 bits. Only 2 cluster identifier bits are assigned to this cluster type. Thus total 6 bits can represent any vowel in the text file. H12 is consonant only case. Consonant is represented by 5 bits. Only 2 header bits are assigned to this case. Thus total 7 bits can represent any consonant in the text file. H13 is 'consonant+matra' case. Consonant is represented by 5 bits and matra is represented by 4 bits. Only 2 cluster identifier bits are assigned to this case. Thus total 11 bits (2+5+4) can represent any 'consonant+matra' in the text file. H22 is 'consonant+halant+consonant' case. Consonant is represented by 5 bits and halant is represented by 4 bits. Total 5+4+5=14 bit for the cluster. Here 2+3 cluster identifier bits are assigned to this case. Thus total 19 bits can represent any 'consonant+halant+consonant' in the text file.

In one embodiment, once the set of character tables and the cluster table is created, in the next step, the input string accepting module 214 is configured to accept a text file containing input text string. The text file/input text string is passed line by line to splitter function enabled by the input string analysis module 216, the splitter function is configured to break the input text string into a number of clusters. For identifying the boundaries of the cluster, the cluster types and the length of the cluster in the cluster table are used. Further, depending upon the number of characters in each cluster, the applicable bit formats are recognized based on occurrences of vowel, consonant, matra, number_nukta and English characters combination in these clusters.

Further, the cluster identifier for each cluster is determined by the cluster generation module 218. Once the cluster identifier is identified, the compressed string generation module 220 is configured to generate a compressed text string corresponding to each cluster from the identified clusters. For this purpose, the compressed string generation module 220 sequentially analyzes each cluster and generates the compressed text string, wherein the compressed text string comprises a cluster identifier corresponding to each cluster followed by associated bit format. The bit format represents a shorten bit representation corresponding to each character in the cluster. In a similar manner, all the clusters in the input text string are analyzed and accordingly the complete compressed string is generated. This cycle is repeated for all clusters in the input text string.

In one embodiment, at the end of generated compressed string, there may be bit stream consist of number of 1's and 0's. The compressed string generation module 220 is configured to divide the compressed text string to identify number of bytes in a line and number of bits in a last byte of the line. Number of bits in last byte is very important information as everything written in the compressed text string is of minimum byte size, but significant (actual) bit in a stream may contain fewer bits. At the time of decompression 'number of bits in last byte' is used to discard remaining bits which is just a padding to have a byte size. For this purpose, 2 bytes are allotted to 'number of bytes in a line' information so that big line of 64K characters can be accommodated in a single line. For 'number of bits in last byte' only one byte is sufficient. Generated compressed text file contains the compressed text string, 'number of bytes in a line' is written, then 'number of bits in a last byte' is written and then bit stream corresponding to the clusters is written in a hex format. Same process is repeated for line after line and complete compressed file is generated. The process of compressing a text data string in Devanagari script is represented in FIG. 8.

In one embodiment, the decompression system 108 is configured to accept the compressed file and read the compressed text file byte by byte. First two bytes in the compressed file are assigned to 'number of bytes in a line' and third byte is assigned to 'number of bits in a last byte'. After reading the third byte, the byte by byte reading and decompression is continued by the decompression system 108 till number of bytes, in a line, is present. The last byte is read and only relevant bits are considered, as mentioned in 'number of bits in a last byte' while decompression. Rest bits from the last byte are discarded. At the end of line CR/LF is inserted. This makes complete line decompression and next line start with same process.

In one embodiment, the forth byte onwards actual decompression of the compressed clusters is initiated. First 2 bits are read to identify the cluster identifier from H11, H12 or H13, using which the first cluster is compressed. Then according to the bit format defined applicable to the cluster identifier, the further bits are read and are converted into Unicode character using the vowel, consonant, matra, number_nukta and English character table. If first 2 bits of header are 11 then another 3 bits are read to identify cluster identifier under which the first cluster was compressed. Further, with the help of bit format associated with the cluster identifier and set of character tables, characters in shorten bit representations are decompressed. If first 2 bits in the bit stream are 11 and next 3 bits are 111 then another 4 bits are read to identify the case under which the cluster falls and got compressed. Further, with the help of bit format and character tables the decompression is achieved. The process of decompressing a text data string in Devanagari script is represented in FIG. 9.

The cluster table used for compression and decompression is described in table 8.

TABLE 10

Cluster table with cluster types for Devanagari script

| Sr. No. | Total Unicode Chars | Cluster Identifier (Header) | Bit format | Description |
|---|---|---|---|---|
| 1 | 1 | 00 | 4 | Vowel: 4 bits from Vowel Table representing particular vowel. |
| 2 | 1 | 01 | 5 | Consonant: 5 bits from Consonant Table representing particular consonant. |
| 3 | 2 | 10 | 5 + 4 | Consonant + Matra |
| 4 | 3 | 11000 | 5 + 4 + 4 | Consonant + Matra + Matra |
| 5 | 3 | 11001 | 5 + 4 + 5 | Consonant + Halant + Consonant: this case contains consonant, halant, consonant combination. |
| 6 | 4 | 11010 | 5 + 4 + 5 + 4 | Consonant + Halant + Consonant + Matra: this case contains consonant, halant, consonant combination. |
| 7 | 5 | 11011 | 5 + 4 + 5 + 4 + 4 | Consonant + Halant + Consonant + Matra + Matra |
| 8 | 1 | 11100 | 6 | Numbers/NuktaChar/Symbol/Punctuation |
| 9 | 1 | 11101 | 6 | EnglishChar from English Table |
| 10 | 1 | 11110 | 16 | UnicodeAs_It_Is |
| 11 | 1 | 111110000 | 7 | Hindi_07Bits (instead of 0915, only 15 is written and while decompression 09 will be appended) |
| 12 | 2 | 111110001 | 4 + 4 | Vowel + Matra/Sp. Matra |
| 13 | 2 | 111110010 | 5 + 4 | Consonant + Sp. Matra |
| 14 | 2 | 111110011 | 6 + 4 | NuktaChar + Matra |
| 15 | 3 | 111110100 | 5 + 4 + 6 | Consonant + Halant + NuktaChar |
| 16 | 3 | 111110101 | 6 + 4 + 5 | NuktaChar + Halant + Consonant |
| 17 | 3 | 111110110 | 5 + 4 + 4 | Consonant + Sp. Matra + Matra |
| 18 | 4 | 111110111 | 5 + 4 + 6 + 4 | Consonant + Halant + NuktaChar + Matra |
| 19 | 4 | 111111000 | 6 + 4 + 5 + 4 | NuktaChar + Halant + Consonant + Matra |
| 20 | 4 | 111111001 | 5 + 4 + 5 + 4 | Consonant + Halant + Consonant + Sp. Matra |
| 21 | 5 | 111111010 | 5 + 4 + 6 + 4 + 4 | Consonant + Halant + NuktaClar + Matra + Matra |
| 22 | 5 | 111111011 | 6 + 4 + 5 + 4 + 4 | NuktaChar + Halant + Consonant + Matra + Matra |
| 23 | 5 | 111111100 | 5 + 4 + 5 + 4 + 5 | Consonant + Halant + Consonant + Halant + Consonant |
| 24 | 5 | 111111101 | 5 + 4 + 5 + 4 + 4 | Consonant + Halant + Consonant + Sp. Matra + |

TABLE 10-continued

Cluster table with cluster types for Devanagari script

| Sr. No. | Total Unicode Chars | Cluster Identifier (Header) | Bit format | Description |
|---|---|---|---|---|
| 25 | 6 | 111111110 | 5 + 4 + 5 + 4 + 5 + 4 | Matra Consonant + Halant + Consonant + Halant + Consonant + Matra |
| 26 | 7 | 111111111 | 5 + 4 + 5 + 4 + 5 + 4 + 4 | Consonant + Halant + Consonant + Halant + Consonant + Matra + Matra |

Figure 6:
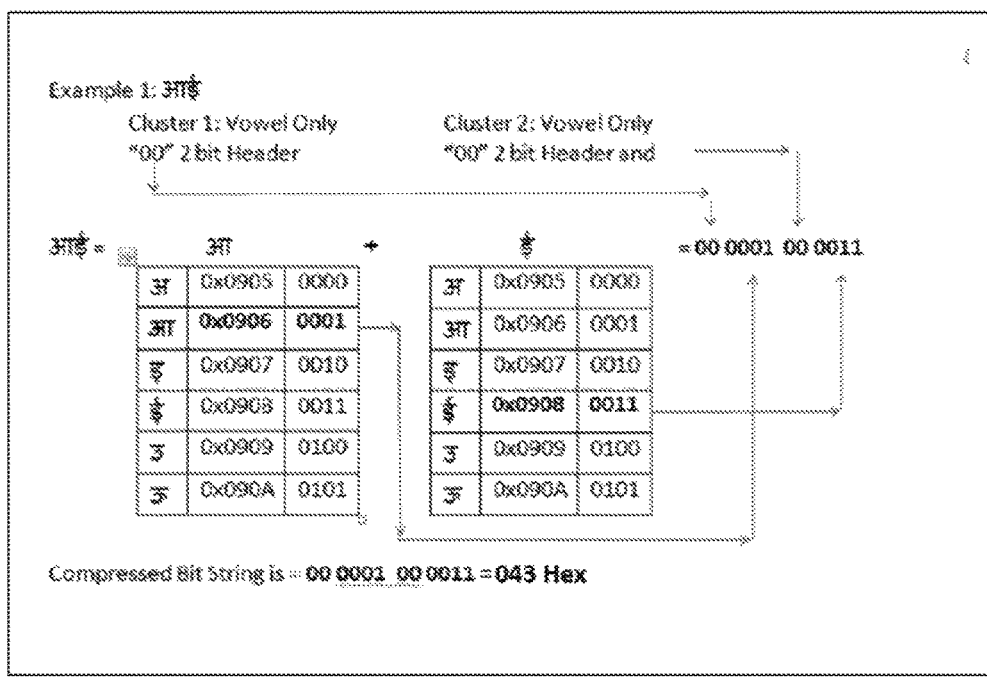
FIGS. 6 and 7 illustrate examples of compressing a word using the compression system, in accordance with an embodiment of the present subject matter.
Figure 7:
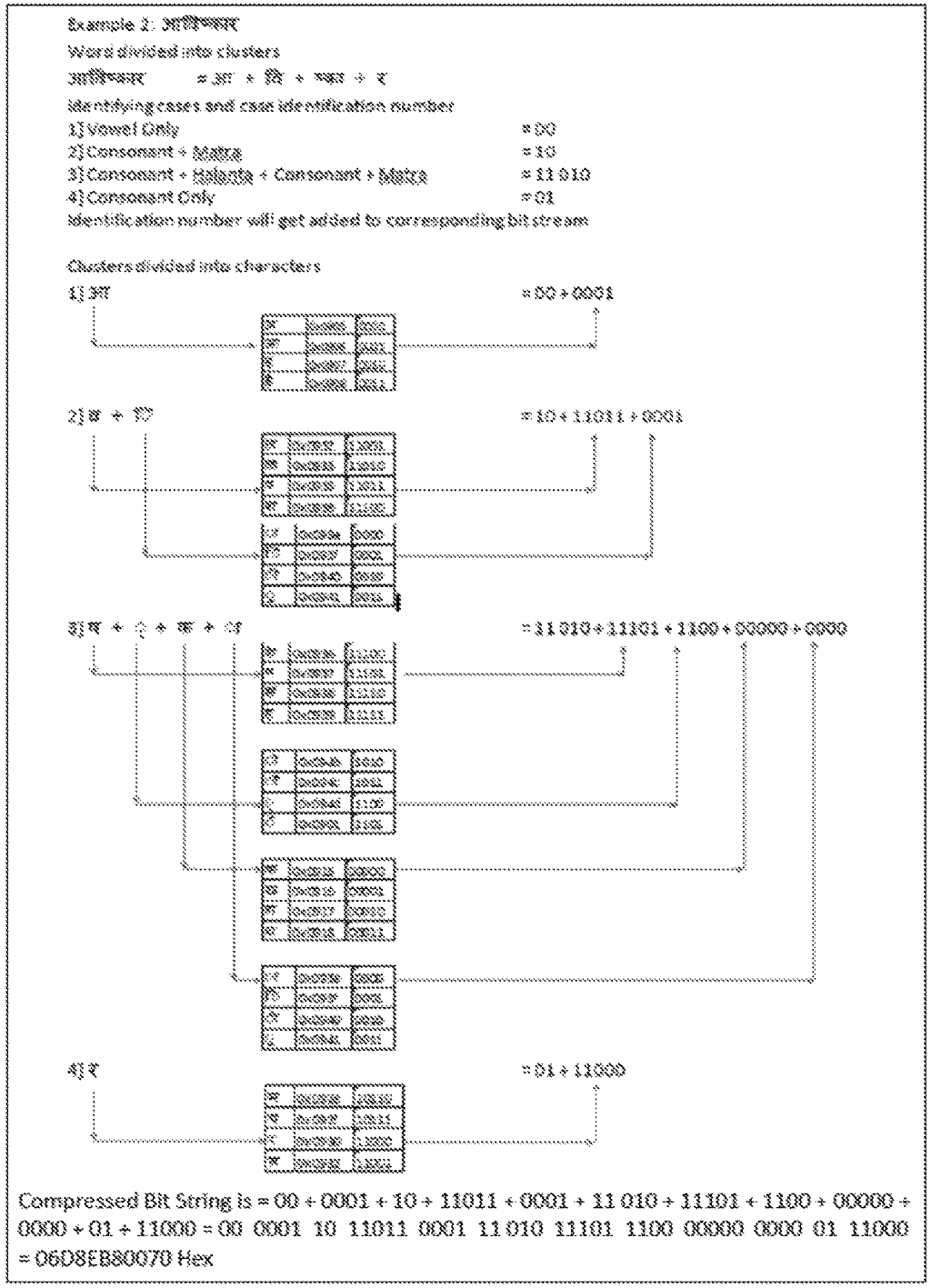

The process of cluster identification and compression for the Devanagari words "आई" and "आविष्कार" in Unicode format is explained in FIGS. 6 and 7. The compressed bit string for the word "आई" is "00 0001 00 0011" (i.e. 043 Hex) and compressed bit string for the word "आविष्कार" is "=00+0001+10+11011+0001+11 010+11101+1100+00000+ 0000+01+11000=00 0001 10 11011 0001 11 010 11101 1100 00000 0000 01 11000" (i.e. 06D8EB80070 Hex).

FIG. 10 illustrates examples of Devanagari Script word with different cluster types applicable to at least one cluster in the word.

Although implementations for methods and systems for compression and decompression of text data has been described, it is to be understood that the appended claims are not necessarily limited to the specific features or methods described. Rather, the specific features and methods are disclosed as examples of implementations for compression and decompression of text data.

We claim:

1. A compression system for compression of text data, the compression system comprising:
a memory; and
a processor coupled to the memory, wherein the processor is configured to execute programmed instructions stored in the memory to:
maintain a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
accept an input text string comprising a combination of Unicode characters;
classify the input text string into a set of clusters based on the set of cluster types in the cluster table, wherein each cluster corresponds to an Unicode character or a valid combination of two or more Unicode characters in the input text string;
identify a cluster identifier, from the cluster table, corresponding to each cluster from the set of clusters;
identify a shortened bit representation corresponding to each character, in each cluster, from the set of character tables; and
generate a compressed text string, corresponding to the input text string, by representing each cluster with a corresponding cluster identifier followed by the shortened bit representation corresponding to each character in the cluster.

2. The compression system of claim 1, wherein the shortened bit representation is based on the number of characters in each of the character table.

3. The compression system of claim 1, wherein the shortened bit representation is unique for each character in the character table.

4. The compression system of claim 1, wherein the cluster identifier is of a variable bit length, wherein the variable bit length is assigned based on the frequency of occurrence of the cluster.

5. The compression system of claim 1, wherein the valid combination is determined based on a cluster types associated with at least one language of a set of languages.

6. A decompression system for decompression of compressed text data, the decompression system comprising:
a memory; and
a processor coupled to the memory, wherein the processor is configured to execute programmed instructions stored in the memory to:
maintain a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
accept a compressed text string, wherein the compressed text string is a set of clusters, wherein each cluster is represented with a cluster identifier followed by shortened bit representation corresponding to each Unicode character in each cluster;
classify the compressed text string into a set of clusters, wherein each cluster is identified based on a corresponding cluster identifier and the set of cluster types in the cluster table;
identify a shortened bit representation and corresponding character table for each character in the cluster based on the cluster type applicable to the cluster; and
generate a Unicode text string by representing each shortened bit representation in the cluster with a corresponding Unicode character, wherein the Unicode character is identified from the corresponding character table.

7. The decompression system of claim 6, wherein the shortened bit representation is based on the number of characters in each of the character table.

8. The decompression system of claim 6, wherein the shortened bit representation is unique for each character in the character table.

9. The decompression system of claim 6, wherein the cluster identifier is of a variable bit length, wherein the variable bit length is assigned based on the frequency of occurrence of the cluster.

10. The decompression system of claim 6, wherein the valid combination is determined based on a cluster types associated with at least one language of a set of languages.

11. A method for compression of text data, the method comprising steps of:
   maintaining, by a processor, a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
   accepting, by the processor, an input text string comprising a combination of Unicode characters;
   classifying, by the processor, the input text string into a set of clusters based on the set of cluster types in the cluster table, wherein each cluster corresponds to an Unicode character or a valid combination of two or more Unicode characters in the input text string;
   identifying, by the processor, a cluster identifier, from the cluster table, corresponding to each cluster from the set of clusters;
   identifying, by the processor, a shortened bit representation corresponding to each character, in each cluster, from the set of character tables; and
   generating, by the processor, a compressed text string, corresponding to the input text string, by representing each cluster with a corresponding cluster identifier followed by the shortened bit representation corresponding to each character in the cluster.

12. A method for decompression of compressed text data, the method comprising steps of:
   maintaining, by a processor, a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
   accepting, by the processor, a compressed text string, wherein the compressed text string is a set of clusters, wherein each cluster is represented with a cluster identifier followed by shortened bit representation corresponding to each Unicode character in each cluster;
   classifying, by the processor, the compressed text string into a set of clusters, wherein each cluster is identified based on a corresponding cluster identifier and the set of cluster types in the cluster table;
   identifying, by the processor, a shortened bit representation and corresponding character table for each character in the cluster based on the cluster type applicable to the cluster, and
   generating, by the processor, a Unicode text string by representing each shortened bit representation in the cluster with a corresponding Unicode character, wherein the Unicode character is identified from the corresponding character table.

13. A non-transitory computer readable medium embodying a program executable in a computing device for compression of text data, the computer program product comprising:
   a program code for maintaining a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
   a program code for accepting an input text string comprising a combination of Unicode characters;
   a program code for classifying the input text string into a set of clusters based on the set of cluster types in the cluster table, wherein each cluster corresponds to an Unicode character or a valid combination of two or more Unicode characters in the input text string;
   a program code for identifying a cluster identifier, from the cluster table, corresponding to each cluster from the set of clusters;
   a program code for identifying a shortened bit representation corresponding to each character, in each cluster, from the set of character tables; and
   a program code for generating a compressed text string, corresponding to the input text string, by representing each cluster with a corresponding cluster identifier followed by the shortened bit representation corresponding to each character in the cluster.

14. A non-transitory computer readable medium embodying a program executable in a computing device for decompression of compressed text data, the computer program product comprising:
   a program code for maintaining a set of character tables and a cluster table in the memory, wherein each character table stores a set of Unicode characters corresponding to a character class of a set of characters classes, wherein each Unicode character from the character table is assigned with a shortened bit representation, and wherein the cluster table is configured to maintain a set of cluster types and a cluster identifier corresponding to each of the cluster type, wherein each cluster type corresponds to a character class or a valid combination of two or more character classes represented by the set of character tables;
   a program code for accepting a compressed text string, wherein the compressed text string is a set of clusters, wherein each cluster is represented with a cluster identifier followed by shortened bit representation corresponding to each Unicode character in each cluster;

a program code for classifying the compressed text string into a set of clusters, wherein each cluster is identified based on a corresponding cluster identifier and the set of cluster types in the cluster table;

a program code for identifying a shortened bit representation and corresponding character table for each character in the cluster based on the cluster type applicable to the cluster; and a program code for generating a Unicode text string by representing each shortened bit representation in the cluster with a corresponding Unicode character, wherein the Unicode character is identified from the corresponding character table.

* * * * *